United States Patent [19]

Bechtel et al.

[11] Patent Number: 5,223,741
[45] Date of Patent: Jun. 29, 1993

[54] PACKAGE FOR AN INTEGRATED CIRCUIT STRUCTURE
[75] Inventors: Richard L. Bechtel, Sunnyvale; Mammen Thomas, San Jose; James W. Hively, Sunnyvale, all of Calif.
[73] Assignee: Tactical Fabs, Inc., Fremont, Calif.
[21] Appl. No.: 402,202
[22] Filed: Sep. 1, 1989
[51] Int. Cl.$^5$ .................. H01L 23/48; H05K 7/06
[52] U.S. Cl. .................. 257/678; 257/698; 257/701; 257/704
[58] Field of Search ............ 351/74, 81; 257/628, 257/698, 701, 704

[56] References Cited

U.S. PATENT DOCUMENTS

| | | | |
|---|---|---|---|
| 3,554,821 | 1/1971 | Caulton et al. | 357/74 |
| 3,908,155 | 9/1975 | Skinner | 317/100 |
| 3,959,579 | 5/1976 | Johnson | 357/74 |
| 4,000,509 | 12/1976 | Jarvela | 357/81 |
| 4,076,955 | 2/1978 | Gates et al. | 174/52 FP |
| 4,151,548 | 4/1979 | Klein et al. | 357/82 |
| 4,172,261 | 10/1979 | Tsuzuki et al. | 357/74 |
| 4,203,127 | 5/1980 | Tegge, Jr. | 357/74 |
| 4,441,119 | 4/1984 | Link | 357/80 |
| 4,498,121 | 2/1985 | Breedis et al. | 357/70 |
| 4,577,214 | 3/1986 | Schaper | 357/74 |
| 4,603,374 | 7/1986 | Wasielewski | 361/389 |
| 4,614,194 | 9/1986 | Jones et al. | 357/80 |
| 4,672,151 | 6/1987 | Yamamura et al. | 357/74 |
| 4,680,618 | 7/1987 | Kuroda et al. | 357/74 |
| 4,745,455 | 5/1988 | Glascock, II et al. | 357/74 |
| 4,755,910 | 7/1988 | Val | 357/74 |
| 4,811,166 | 3/1989 | Alvarez et al. | 357/81 |
| 4,825,282 | 4/1989 | Fukaya | 357/81 |
| 4,873,566 | 10/1989 | Hokanson et al. | 357/74 |
| 4,879,588 | 11/1989 | Ohtsuka et al. | 357/80 |
| 4,899,208 | 2/1990 | Dietsch et al. | 357/74 |
| 4,961,788 | 8/1988 | Dietrich et al. | 357/81 |
| 4,982,311 | 1/1991 | Dehaine et al. | 357/74 |

FOREIGN PATENT DOCUMENTS

| | | | |
|---|---|---|---|
| 303808 | 2/1989 | European Pat. Off. | 357/80 |
| 52-75180 | 6/1977 | Japan . | |
| 54-56364 | 5/1979 | Japan . | |
| 58-10850 | 1/1983 | Japan | 357/80 |
| 58-66344 | 4/1983 | Japan | 357/80 |
| 60-258932 | 12/1985 | Japan . | |
| 62-248243 | 10/1987 | Japan . | |
| 63-6861 | 1/1988 | Japan . | |
| 63-114148 | 5/1988 | Japan | 357/74 |
| 63-175452 | 7/1988 | Japan | 357/74 |

OTHER PUBLICATIONS

"Film on Metal Leaded Chip Carrier", *IBM TDB*, vol. 31, No. 1, Jun./1988, p. 2.
"Common Substrate Design for Wirebond/Hermetic VLSI Devices", *IBM TDB*, vol. 27, No. 11, Apr./85, p. 6366.
Costlow, *TI, Hitachi develop package for 16-Mbit*, Electronic Engineering Times, Issue 628, Feb. 11, 1991, (p. 1 and p. 110).
*Wafer Scale Integration*, G. Saucier and J. Trilbe (Editors), Elsevier Science Publishers B.V. 1986, pp. 321–344, "Wafer Scale Integration (WSI) Packaging" by Christian Val.
*International Workshop on Defect and Fault Tolerance in VLSI Systems*, Sprigfield, Mass. (IEEE), Oct. 6, 1988, "Wafer Scale Revisited," by Douglas L. Peltzer, Tactical Fabs, Inc.

Primary Examiner—Eugene R. LaRoche
Assistant Examiner—Viet Q. Nguyen
Attorney, Agent, or Firm—Skjerven, Morrill, MacPherson, Franklin & Friel

[57] ABSTRACT

A package for housing a large scale semiconductor integrated circuit structure, such as a wafer or an assemblage of chips in a hybrid configuration, comprises a heat spreading and dissipating base plate to which the wafer or hybrid circuit is directly bonded. Electrical connections from the periphery of the package interior to the wafer are preferably made with equal length TAB (Tape Automated Bonding) strips connected to electrically conductive pads located along a diameter of the wafer or the centerline of the hybrid circuit. If hermeticity is desired, the integrated circuit structure is encircled by a boundary strip of sandwich construction through which signals are routed, and to which a lid is attached. For hermeticity, the integrated circuit structure is surrounded on all sides with a barrier combining metal and ceramic; the remainder of the package may be constructed from conventional printed circuit board materials. The package can be made arbitrarily large without encountering the problems typically associated with hermetic structures which utilize large areas of ceramic materials.

47 Claims, 10 Drawing Sheets

PACKAGE FOR AN INTEGRATED CIRCUIT STRUCTURE

BACKGROUND OF THE INVENTION

1. Field of the Invention

This invention relates to a low profile package which is adapted for use with semiconductor wafers and/or with one or more semiconductor chips. It is suitable for use in an operating environment where efficient heat dissipation from the package is essential.

2. Prior Art

Wafer scale integration involves forming an integrated circuit utilizing an entire semiconductor wafer. Typically a semiconductor wafer may have a diameter of up to eight inches or more. The wafer is not diced to form chips, but rather is utilized in its entirety to form the integrated circuit. A wafer containing such an integrated circuit must be protected in its operating environment against contamination, as well as against mechanical and thermal stress. A package for protecting and supporting such a wafer must also provide an efficient method for cooling the wafer and must occupy a minimal amount of space to allow it to be used in a crowded environment, e.g. in a compact chassis housing multiple electronic components.

Figure 1:
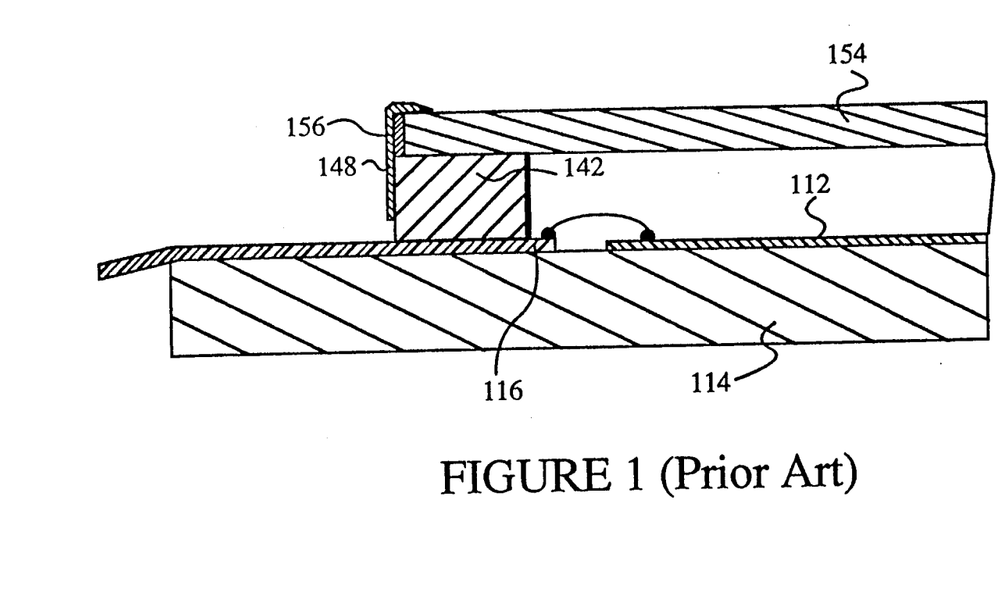
FIG. 1 is a cross sectional view of a prior art device disclosed in U.S. Pat. No. 4,706,955.

Several approaches have been used to provide such packages. For example, in U.S. Pat. No. 4,603,374 entitled "Packaging Module for a Semiconductor Wafer" and assigned to Motorola, Inc., the wafer is supported on thermally conductive elastomeric pads and is situated under a printed circuit board. The printed circuit board is equipped with electrically conductive plastic pads which engage contact pads on the periphery of the wafer to create electrical contact between wafer and circuit board. U.S. Pat. No. 4,555,024, entitled "Packaging Unit for Semiconductor Wafers" and assigned to Wacker-Chemie GmbH, discloses spring tongues which are used in conjunction with retention cones on the inner surface of the package lid to hold the wafer in place. U.S. Pat. No. 4,706,955, entitled "Package for Hermetically Sealing Electronic Circuits", discloses a hermetic seal for a semiconductor wafer package. As shown in FIG. 1, this seal consists of a base 114 supporting the electronic device 112, to which is attached a sealing ring 142 surrounding the device. Signal leads 116 extend under this sealing ring 142. A flange 148 is bonded to the sealing ring 142, and the gap between flange 148 and lid 154 is filled with solder 156 to provide a hermetic seal. U.S. Pat. No. 4,000,509, entitled "High Density Air Cooled Wafer Package Having Improved Thermal Dissipation", discloses a package in which electrical connections are made around the periphery of the wafer. In this package, the wafer is forced against a heat sink through deformation of springlike elements; thermal grease is used between wafer and heat sink. U.S. Pat. No. 3,908,155, entitled "Wafer Circuit Package", discloses a package wherein wafers are stacked and electrical interconnections are made using tuning fork type connectors.

All these prior art devices provide electrical connections to points along the periphery of the wafer. This tends to result in large differences in electrical path lengths between the exterior of the package and different areas of the wafer. Several of the prior art devices utilize structural elements, e.g. spring tongues, which increase the bulk of the package.

SUMMARY OF THE INVENTION

In accordance with this invention, a package is provided for semiconductor wafers or comparably sized collections of electronic circuit elements. The package presents a low profile but nevertheless maximizes the space available for active circuit elements. The package includes a heat dissipating base plate. In one embodiment, a semiconductor wafer is directly bonded to this base plate. In another embodiment, one or more integrated circuit chips are mounted on a substrate which is directly bonded to or built upon the base plate. The intimate contact of the wafer or integrated circuit chips to the base plate provides good heat spreading (thus helping to prevent hot spots). The package typically is cooled with air or another fluid coolant which is in direct contact with the lower surface of the base plate; the package therefore also dissipates heat efficiently. In one embodiment, the base plate also functions as a ground plane, and serves to reduce electronic noise pickup.

Electronic signals are preferably transmitted between points on the wafer and other points within, but at the periphery of, the package by Tape Automated Bonding ("TAB") strips which are preferably connected at one end to lines which extend through the package to external devices and at the other end to pads along a diameter of the wafer. Metallic traces formed on and as part of the wafer connect these pads to semiconductor integrated circuit elements formed in the wafer. Redundant pads, electrically common, and in close proximity to each other, are preferably provided along or near the same diameter of the wafer to allow faulty connections to be corrected or replaced, or to allow a TAB strip to be removed for other purposes and later reconnected or replaced with a new one. The redundancy is provided in case a pad is damaged in the process of disconnecting a TAB bond. Location of the pads along a diameter of the wafer that is parallel to one side of the package tends to equalize the lengths of transmission lines to various parts of the wafer and therefore equalize the timing and amplitude of the signals associated with different parts of the wafer. It also minimizes voltage differences due to resistive drops along conductive lines connecting different portions of the wafer. Although, in general, different sizes of TAB strips can be employed, this invention permits use of identical TAB strips to transmit signals to the entire wafer, thus reducing production costs, and standardizing the TAB attachment process.

The package permits, but does not require, hermetic protection of the wafer. Hermetic sealing protects against atmospheric contamination which corrodes exposed metallic surfaces. The invention provides a hermetic seal and a novel routing of the electronic signals through this hermetic seal.

In conventional packages, a hermetic seal is often obtained by constructing non-metallic parts from ceramic materials such as alumina. These ceramic materials typically cannot be used for structures more than approximately four inches in diameter, due to problems with uneven shrinkage of the ceramic and its supporting structure in the manufacturing process. This shrinkage causes warpage and difficulty in holding tolerances on large dimensions. A hermetic embodiment of the package of this invention novelly surrounds the semiconductor wafer with metal and ceramic or glass while permitting non-metallic parts of the package to be made from conventional printed circuit board material. This embodiment does not have the size limitations, and other common problems associated with curing, which are inherent in hermetic packages of conventional, predominantly ceramic, construction.

The package can be interfaced to circuit elements outside the package using standard edge or pin connectors. In accordance with the needs of the user, these connectors may be located on one or several sides of the package.

DETAILED DESCRIPTION

Figure 2A:
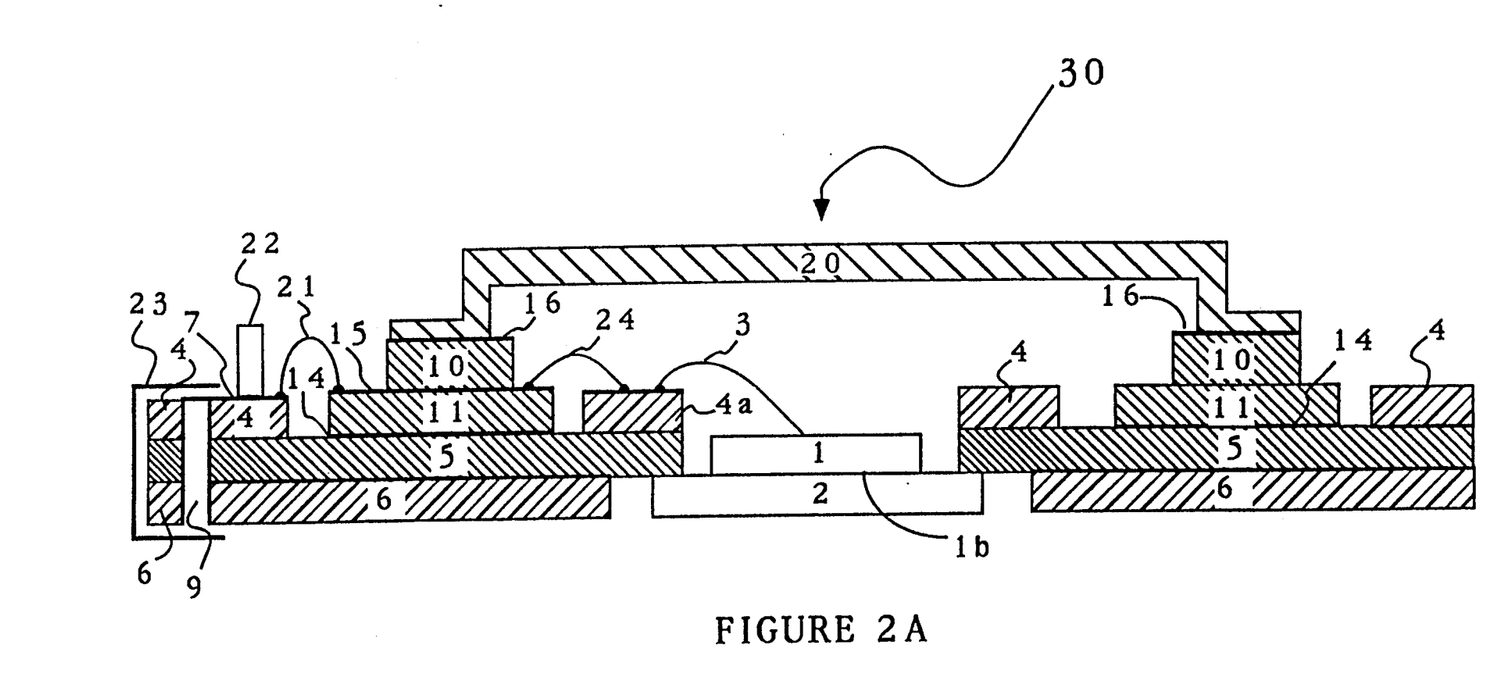
FIG. 2A is a cross sectional view of a hermetic embodiment of the invention.

FIG. 2A is a cross sectional view of an embodiment 30 of the invention which incorporates a hermetic seal. A wafer 1 of semiconductor material, typically silicon, is attached to a metallic base plate 2 which is in turn attached to other parts of the package, as will be explained later. Metallic base plate 2 is preferably both a good thermal conductor and a good electrical conductor. In this embodiment, metallic base plate 2 provides mechanical support, contributes to a hermetic seal, serves as a heat spreader and heat sink and also serves as a ground plane to shield against electrical interference. The location of this base plate directly adjacent to a stream of air or another fluid facilitates efficient heat dissipation. Base plate 2 should have a coefficient of thermal expansion (CTE) as close as possible to that of wafer 1 to prevent mechanical stress to the wafer due to variations in the temperature of the package. Also, base plate 2 should have a CTE as close as possible to adjacent parts of the package to prevent mechanical stress to the package due to variations in the temperature of the package. As the magnitude of the expected variation in package temperature or the expected number of temperature cycles becomes larger, good matching of the CTE values of the package components becomes more critical for long product life. For a silicon wafer, the base plate should preferably be made of molybdenum, in order to satisfy this CTE-matching criterion while also providing good thermal conductance. (For example, silicon has a CTE of $2.6 \times 10^{-6}$ in./in./° C.; molybdenum has a CTE of $5 \times 10^{-6}$ in./in./° C. In contrast, typical metals have much higher CTE values. For example, copper has a CTE of $16.9 \times 10^{-6}$ in./in./° C. and aluminum has a CTE of $23 \times 10^{-6}$ in./in./° C. In addition to having a low CTE, molybdenum is also a good conductor of heat. Molybdenum has a thermal conductivity of 85 Btu/hr-ft$^2$-° F.-ft, which compares well with the thermal conductivity of aluminum (99-125 Btu/hr-ft$^2$-° F.-ft).) The molybdenum is preferably laminated on both surfaces with copper in order to improve solderability while also retaining good thermal conductivity from the wafer to the coolant or heat sink. In addition to spreading and dissipating heat, base plate 2 provides structural rigidity to the package 30. The wafer 1 may be attached to base plate 2 with thermal epoxy (e.g. Epo-tek H20 epoxy or another Epo-Tek H Series epoxy, made by Epoxy Technology, Inc., Billerica, Mass.) or solder (e.g. Sn 62 eutectic tin solder or an Indalloy solder made by Indium Corp. of America). If solder is used, the side 1b of wafer 1 facing base plate 2 can be metallized, i.e. coated with a thin solderable metallic layer (typically of nickel or gold) before being soldered to base plate 2 (typically with Sn 62 or Indalloy solder).

Particular care must be taken during the bonding of wafer 1 to base plate 2 to prevent the formation of voids between wafer 1 and base plate 2. These voids create hot spots on the wafer during operation, due to the reduced heat conduction from wafer 1 to base plate 2 at the location of the void. The hot spots thermally stress and fatigue the bond and wafer 1, eventually causing failure of the bond and eventually wafer 1. Consequently, wafer 1 is preferably bonded to base plate 2 in one of the ways described below. Firstly, bonding may be performed by solder reflow in a vacuum. Performing the bonding in a vacuum eliminates trapped air. Alternatively, or in addition, base plate 2 may be perforated, preferably by laser drilling, with an array of holes preferably 15 mils in diameter and 0.1 inches apart. These holes allow gas to escape during the soldering process, and thus help to eliminate voids caused by trapped gas. Solder is then deposited on the bonding surface of the base plate, preferably by solder plating, solder tinning, or screen printing of a solder cream such as Indalloy SN62. The bonding is then performed by heating the base plate, with the solderable wafer placed thereon, in order to melt the solder. If base plate 2 is perforated, suction is preferably applied to the underside of the base plate, removing air voids and drawing solder into the holes. This produces an irregular surface between solder and base plate which resists lateral stress and provides a stronger bond. The base plate 2 and the wafer 1 are preferably heated in an oven, with infrared radiation, or by convection if a vacuum is not being used. A hydrogen atmosphere may be used to reduce oxides on the bonding surfaces, or an inert atmosphere may be used to deter the growth of oxides during the heating process, thus facilitating the bonding process.

To make a package according to the embodiment of FIG. 2A, a hole slightly larger than wafer 1 is cut in a metal core printed circuit board (PCB). The layers of the PCB are denoted by 4, 5 and 6. To expose the metal core 5, the surface layer 6 on the underside of the PCB is routered away, or otherwise removed, from an annular region around the hole. Metal core 5 is then hermetically attached (preferably by soldering) to base plate 2.

Metal core 5 of the PCB is typically in electrical and/or thermal contact with base plate 2. The core of the PCB in this embodiment is typically of the copper-invar-copper type or the copper-molybdenum-copper type. Copper-molybdenum-copper or Invar (a nickel-iron alloy) with laminated copper on either surface is often used because the low CTE values of copper-molybdenum-copper and copper-invar-copper (approximately $6 \times 10^{-6}$ in./in./° C.) are closely matched to the CTE of a silicon wafer and the CTE of the base plate.

In order to allow a hermetic seal to be formed easily, the portion of the package through which electrical leads extend is manufactured as a separate boundary strip or strips. After manufacture, these boundary strips are attached to metallic core 5 of the PCB, which has been exposed by routering away or otherwise removing surface layer 4 of the PCB. A combination of boundary strips including metal leads and, if desired, simpler boundary strips including no metal leads, is attached to metal core 5 so as to form a continuous boundary strip surrounding the wafer 1. The top surface of this continuous boundary strip is of a material to which a protective lid or cover may be hermetically attached. Thus there is a hermetic seal between the lid, the continuous boundary strip, the core of the PCB and the base plate.

Figure 2B:
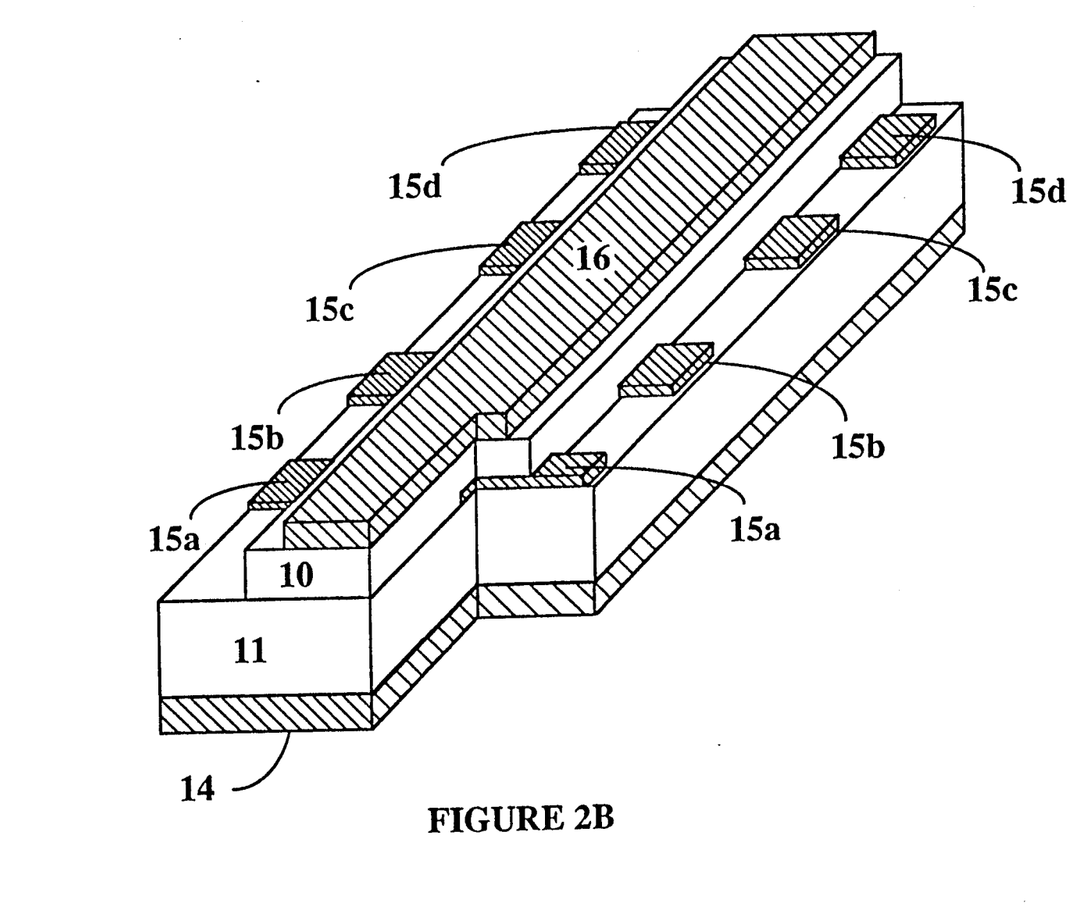
FIG. 2B is a perspective view of a section of the boundary strip of the embodiment shown in FIG. 2A.

Those boundary strips which include conductive leads consist of a sandwich of alternating metallic and ceramic layers. FIG. 2B shows a perspective view of a portion of one such boundary strip. Reference numerals in FIG. 2B denote the same elements as the same reference numerals in FIG. 2A. The metallic layers of the boundary strip are denoted by 14, 15, and 16, and are typically made of tungsten. The insulating layers of the boundary strip are denoted by 10 and 11, and are preferably made of a ceramic such as alumina ($Al_2O_3$) or BeO, or of glass. If a hybrid circuit comprising a plurality of integrated circuit chips interconnected by a glass substrate on which is applied at least one layer of interconnect lines, is to be enclosed by the package, the glass of the boundary strip is preferably of a composition similar to the glass of the hybrid circuit. A laminated copper-invar-copper metal core PCB layer 5 in which the thickness of the metal layers is 20% copper (top), 60% invar (center), 20% copper (bottom) has a CTE of $6.3 \times 10^{-6}$ in./in./° C. Alumina has a CTE of 6.0 to $6.5 \times 10^{-6}$ in./in./° C. which closely matches that of the PCB metal core layer 5, and thus provides an excellent thermal match between boundary strip and PCB. The integrated circuit structure, base plate, boundary strip, and metal core of the printed circuit board should have coefficients of thermal expansion differing by not more than $5 \times 10^{31\ 6}$ in./in./° C. As shown in FIG. 2B, metallic layers 14 and 16 are continuous over the length of the boundary strip while metallic layer 15 consists of discrete traces such as 15a, 15b, 15c, and 15d, for example, along which electronic signals can be propagated. Layer 15 is shown in FIG. 2A as present on only the left side of the structure, but can, of course be present on several sides of the structure if desired. In FIG. 2B, one corner of the section of boundary strip is shown as cut away to better illustrate the construction of the boundary strip.

For ease of manufacture and assembly, such sections are preferably prefabricated and metallized at top, bottom, and both ends. They are then bonded to metal layer 5 and joined end-to-end by butt welding or soldering to form a single unbroken boundary strip within the channel formed by removing a ring from PCB surface layer 4 surrounding wafer 1 down to the surface of core 5, again, by routering or other means. This technique permits the same prefabricated sections to be utilized in a variety of packages. In FIG. 2B, the separate traces of layer 15 are labeled 15a, 15b, 15c and 15d. Typically, several hundred traces such as 15a, 15b, 15c and 15d extend through the boundary strip between layers 10 and 11. In the preferred embodiment, the metallic layers 14, 15 and 16 of the boundary strip are made by screening metallic paste (using masks) onto sheets of unfired alumina, and then firing the resulting assemblage to achieve the structure shown in FIG. 2B. The sheets of unfired alumina are commonly referred to as "green tape" or "green sheet". Firing is typically performed, for example, by Kyocera, Inc. of Kyoto, Japan, at 1500° to 1600° C. in a reducing atmosphere.

In the embodiment shown in FIG. 2A, a preferably metallic protective cover 20 is attached to the metallic surface 16, for example by soldering or electrowelding. In this embodiment, after cover 20 is attached, wafer 1 is completely encased in a hermetic structure consisting of metallic base plate 2, metallic PCB core layer 5, ceramic/metallic boundary layers 10, 11, 14, 15, 16, and metallic cover 20. The remainder of the package, e.g. layers 4 and 6, are preferably made from conventional PCB materials.

A novel feature of the embodiment shown in FIG. 2A is the use of TAB (Tape Automated Bonding) signal strips 3 to pass signals between a centerline of wafer 1 and an edge section 4a. In an embodiment housing a plurality of chips rather than the single wafer 1, these TAB strips 3 may also pass signals between the centerline of the hybrid collection of chips housed within the package. These TAB strips comprise a plurality of parallel conductive lines, encased in an insulating and supporting ribbon, typically Kapton or polyimide. Such material is marketed commercially, for example by Minnesota Mining & Manufacturing Co. In this embodiment, the TAB strips are connected to a section 4a of PCB layer 4, where the signals can be fanned out or otherwise routed. Lines from PCB section 4a are then connected by connectors 24, which are preferably TAB strips or wire bonds, to the metallic traces that make up layer 15. If fanning out or routing is unnecessary, PCB layer 4a can be eliminated and TAB strips 3 can directly connect wafer 1 to the metallic traces in layer 15. The TAB strips are preferably made of copper and polyimide. They preferably contain ground wires or a ground plane, to reduce crosstalk and noise pickup, and form a tuned transmission line. If necessary, excess length is provided in the TAB strips for strain relief purposes.

Exterior ends of the metallic traces in layer 15 are in turn connected to metallic traces 7 at the exterior of the package, e.g. via wire or TAB bonds 21, and thence to electronic circuitry 22 or directly to the edge connector 23. Signals to and from the package are passed through edge connectors 23. The edge connector is selected to suit the user's requirements. FIG. 2A also shows one of a plurality of conductive through-holes 9 extending through the PCB so that, if necessary, signals can be routed through holes 9 to the underside of the PCB. From there they can be connected to the edge connector 23, or pins can be soldered into some of through-holes 9 to provide pin connections. Note that in this embodiment wafer 1 is located in a protective depression formed by base plate 2. This protective depression helps to prevent damage during assembly of the package by keeping wafer 1 out of the way of assembly operations. The protective depression also increases the clearance between lid 20 and wafer 1. This design positions the wafer closer to the level of the center of edge connector 23 and places base plate 2 closer to, or into, the air stream for better cooling. The resulting package is compact because its thickness is close to the thickness of edge connector 23.

Figure 2C:
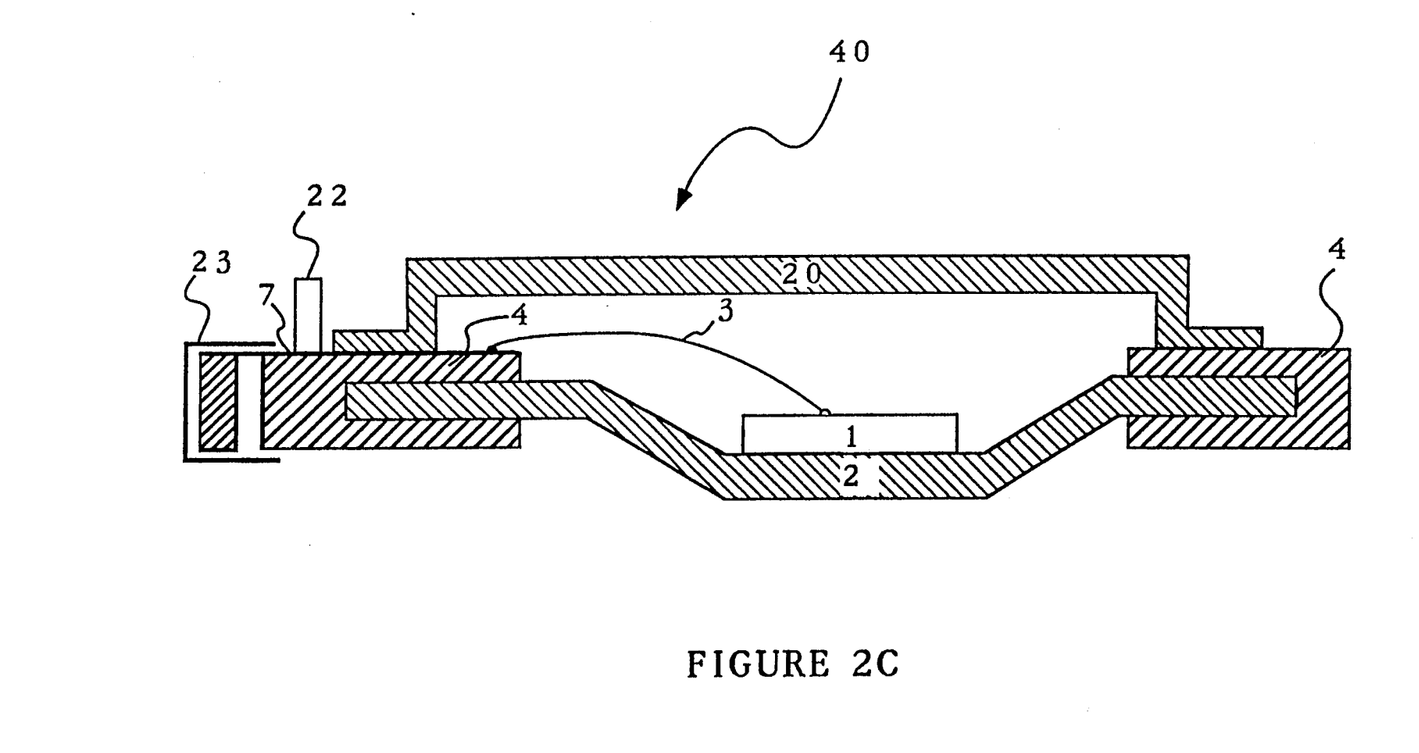
FIG. 2C is a cross sectional view of a nonhermetic embodiment of the invention, in which the base plate is part of a one piece structure which also serves as the core layer of a circuit board.
Figure 2D:
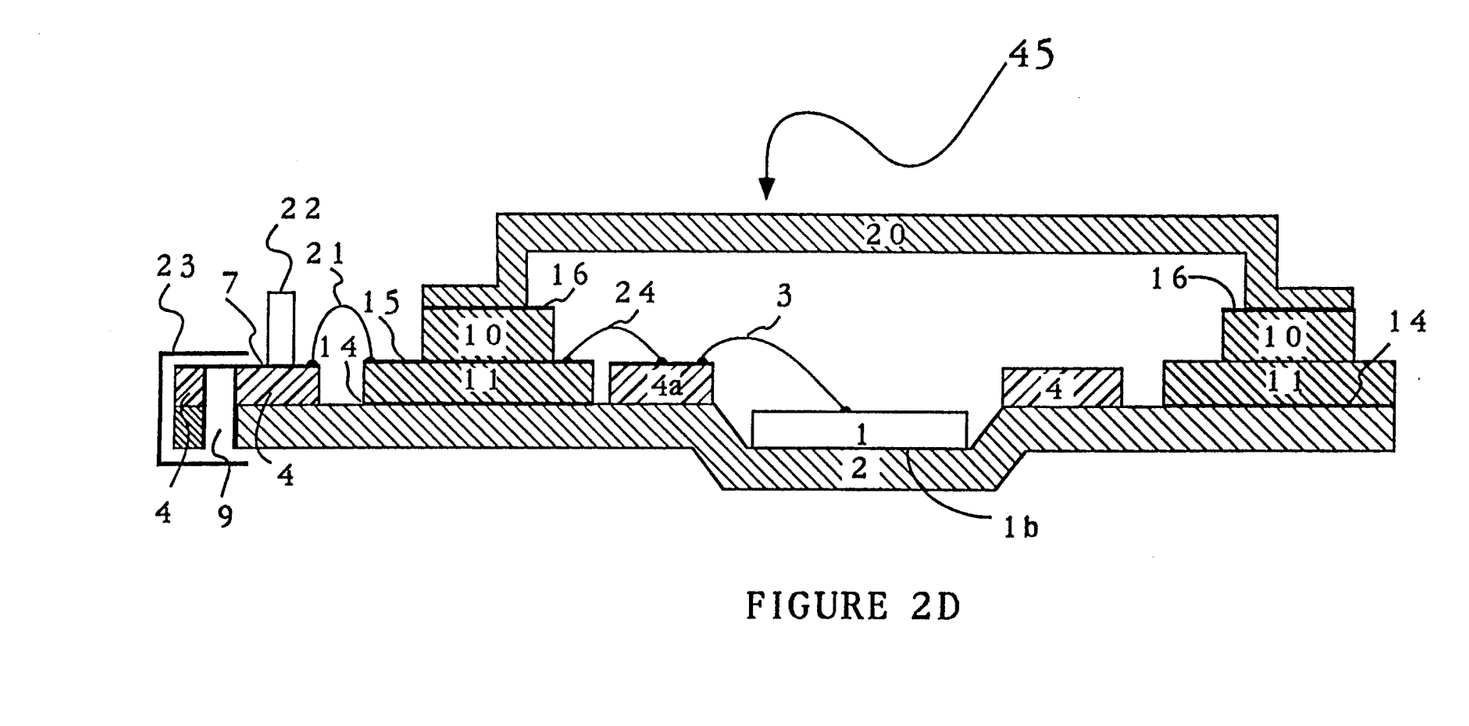
FIG. 2D is a cross sectional view of a hermetic embodiment of the invention, in which the base plate is part of a one piece structure which also serves as the core layer of a circuit board.

In another embodiment 40, shown in FIG. 2C, base plate 2 is formed from part of the PCB core layer 5 by routering a metal core PCB down to the core layer 5 in an area larger than the wafer 1 and then mechanically deforming layer 5 to form a one piece "pan" or heat sink. This design provides a protective recess or pocket for the wafer and extends the lower surface of the base plate 1 into the coolant stream for more efficient heat dissipation. Alternatively, a pan 2 of the same shape can be formed from a metal, preferably molybdenum, after which a PCB 4 can be bonded to the "pan", on one or both sides, around the recessed area where the wafer or other electronic circuit elements are located. The PCB in this embodiment 40 is typically of FR-4 (flame retardant epoxy glass) or polyimide multilayer type. The embodiment shown in FIG. 2C is not hermetic, but is easily converted into a hermetic package through the use of the boundary strips shown in FIG. 2B in the manner shown in FIG. 2D. Like reference numerals in FIGS. 2A, 2C and 2D denote similar elements. Again, if a wafer is used in the embodiment shown in FIG. 2C or 2D, signals are preferably transmitted to it via equal length TAB strips electrically connected to contact pads located along a diameter of the wafer.

Figure 3A:
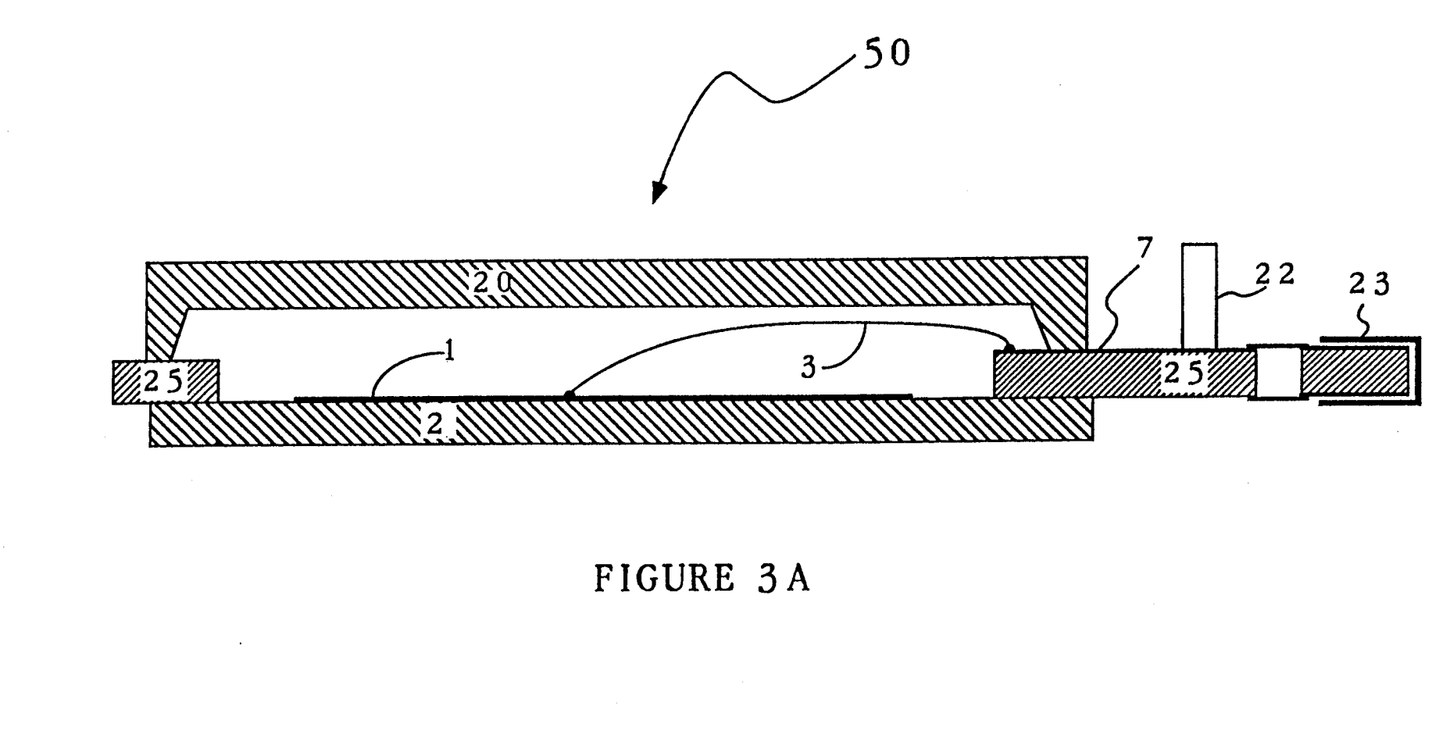
FIG. 3A is a cross sectional view of a nonhermetic embodiment of the invention in which data is transferred to and from a wafer from one edge of the package.
Figure 3B:
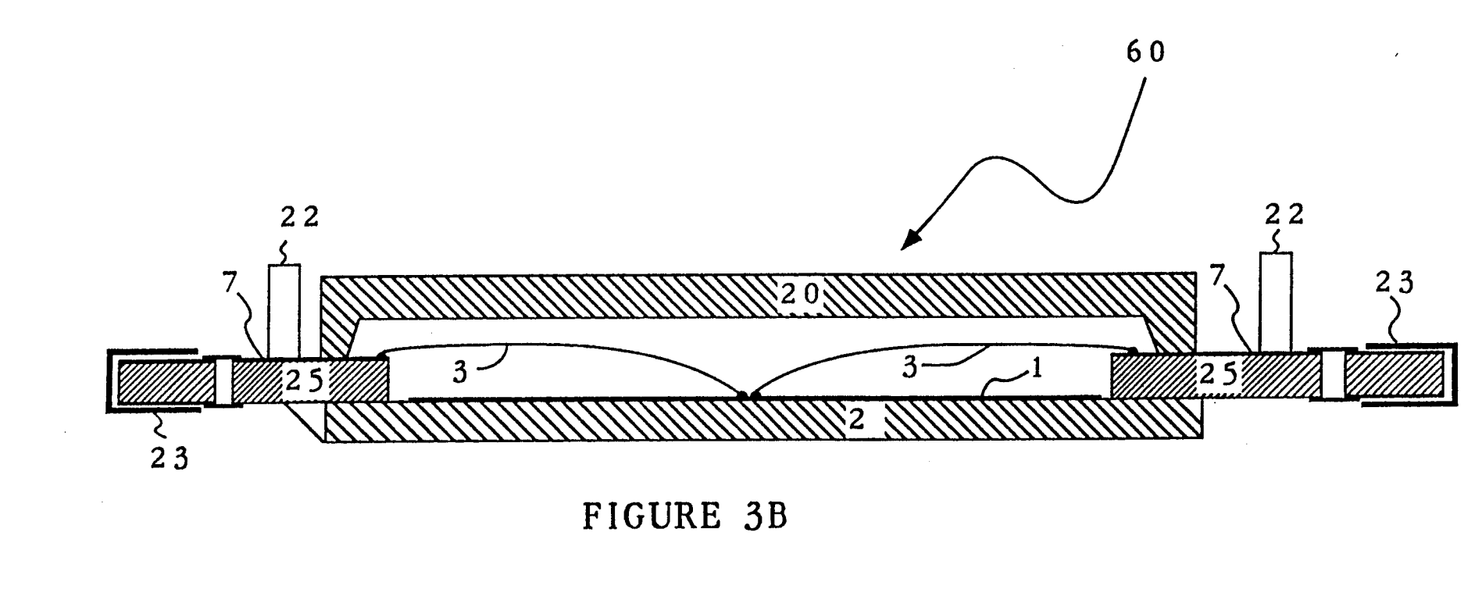
FIG. 3B is a cross sectional view of a nonhermetic embodiment of the invention in which data is transferred to and from a wafer from two edges of the package.

FIGS. 3A and 3B are cross sectional views of two nonhermetic embodiments of the invention. Like reference numerals in FIGS. 2A, 3A, and 3B denote similar elements. In these two embodiments, a wafer 1 is bonded to a base plate/heat spreader 2. In FIG. 3A. (as in FIG. 2A) signals are transmitted between the package 50 and electronic circuitry outside the package via an edge connector 23 situated at one edge of the package. In contrast, in FIG. 3B signals are transmitted to and from the package 60 via edge connectors 23 mounted on two edges of the package. In the embodiments shown in both FIGS. 3A and 3B, TAB strips 3 allow signals to be transmitted to conductive pads located along a diameter of wafer 1. In both FIG. 3A and FIG. 3B base plate 2 is attached to PCB 25. If metal core PCB (e.g. copper-invar-copper or copper-molybdenum-copper) is used, the base plate may be bonded directly to the metal core of the PCB, as in the hermetic embodiment shown in FIG. 2A so that this structure can be used as desired for either hermetic or nonhermetic applications. Alternatively, a PCB without a metal core may be used; this type of PCB is typically made of materials such as glass/epoxy, polyimide or teflon. If a PCB without a metal core is employed, base plate 2 is attached to the surface layer of the PCB rather than to an interior metallic core layer. With a non-metal core PCB, the base plate provides structural rigidity for the package as well as heat dissipation. Metallic traces 7 for carrying electronic signals between the interior and exterior of the package are applied to the surface of the PCB opposite to that surface to which base plate 2 is attached. The protective cover 20 is attached to the PCB, for example by using electrically nonconductive epoxy. A structure manufactured in this way is not hermetic because the epoxy and the PCB are permeable. A PCB without a metal core is preferred for applications where a hermetic seal is not required since it is simple to manufacture and less expensive. Of course, even if a metal core PCB is used, it is possible to attach base plate 2 to an insulating surface layer of this metal core PCB to form a nonhermetic seal. The use of such low CTE metal core PCBs would still be preferred, even if the package hermeticity is not required, when surface mounting of other components is contemplated.

Figure 4A:
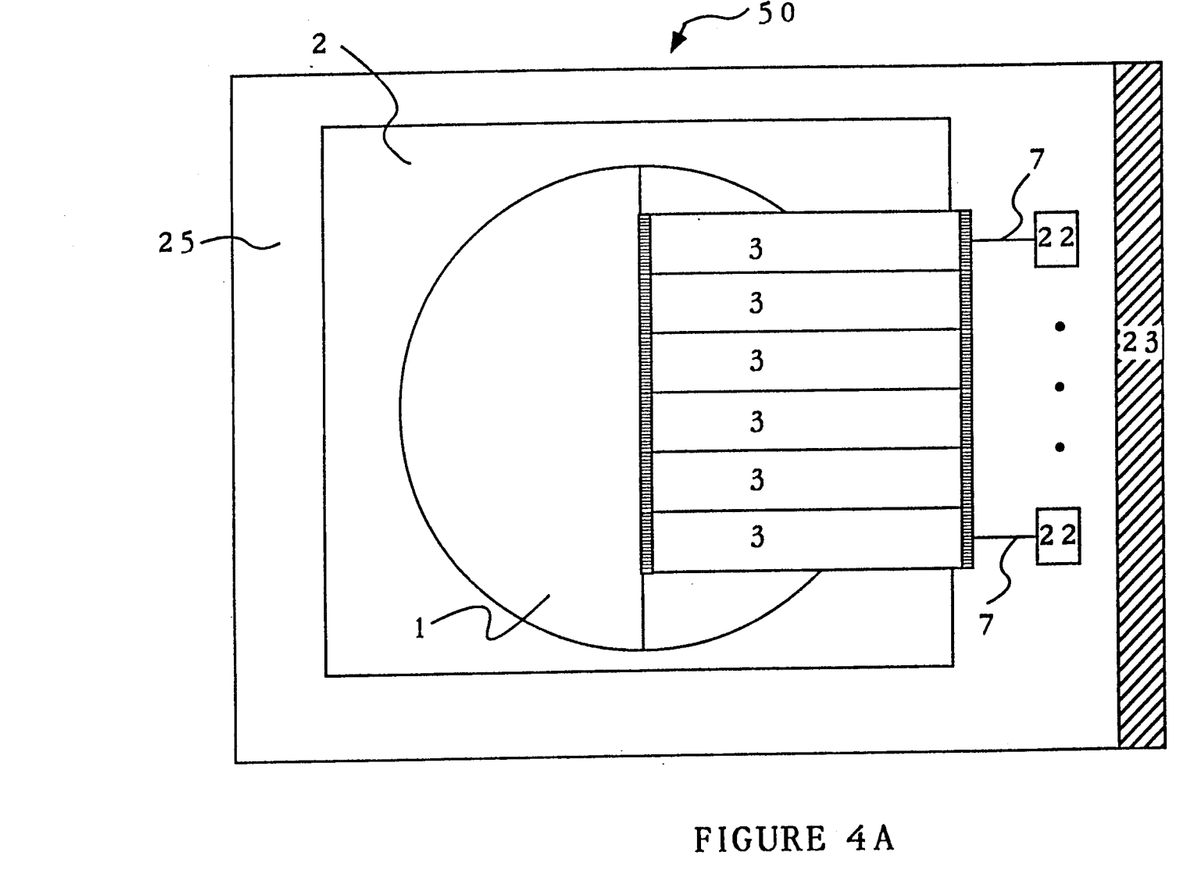
FIG. 4A is a plan view of an embodiment of the invention in which data is transferred to and from a wafer from one edge of the package.
Figure 4B:
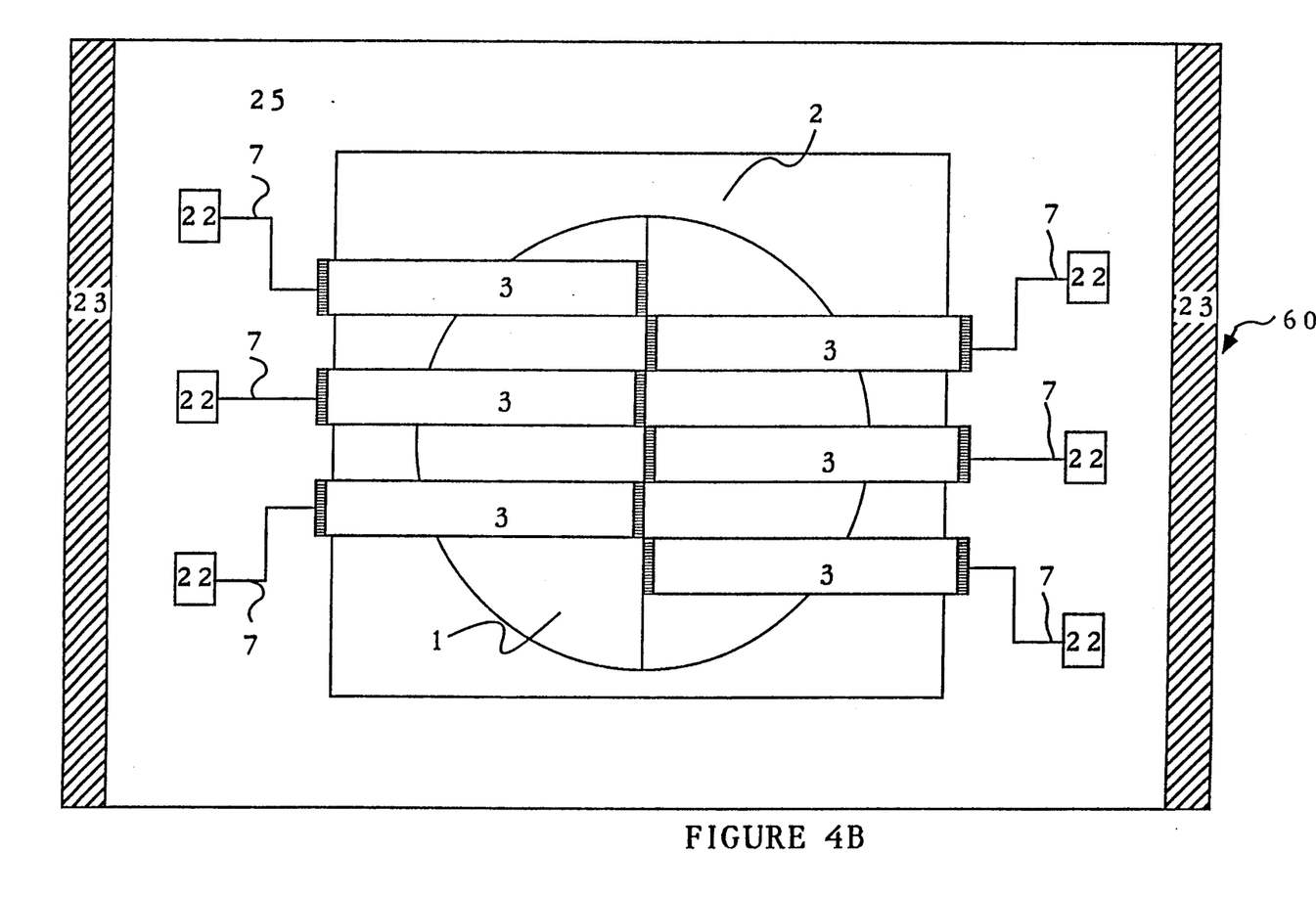
FIG. 4B is a plan view of an embodiment of the invention in which data is transferred to and from a wafer from two edges of the package.

FIG. 4A is a plan view of a package 50 showing a wafer 1 with TAB strips 3 connected to the center of the wafer. In FIG. 4A, as in FIGS. 2A and 3A, the signal input and output to the package occurs at one edge of the package. If the user so requires, data can be transferred to and from the wafer from two sides of the package 60, as shown in FIG. 4B. Like reference numerals in FIGS. 2A, 4A, and 4B denote similar elements. Note that the designs shown in FIGS. 4A and 4B both permit use of identical TAB strips to transmit data to and from all parts of the wafer. This permits cost savings and inventory reduction. A further advantage of the configuration shown in FIG. 4B is that the resulting wider spacing that is possible between signal leads allows looser tolerances to be adopted in signal leads 7 and edge connectors 23. Of course, the configuration of FIG. 4B will be chosen for applications where pin-outs on both sides of the board are desired.

Redundant metallic pads are preferably provided along a diameter of the wafer to allow correction of faulty connections to the TAB strips. With this arrangement, all connections of TAB strips to the wafer are visible and accessible, facilitating visual inspection of the connections and repair of faulty connections. The TAB strips are typically connected to the pads by reflow soldering, thermal compression bonding, or laser welding. If thermal compression bonding is used, a single point bonder capable of making one connection at a time is preferred, because it deals effectively with small irregularities in pad heights. The entire wafer structure after TAB bonding and testing is preferably coated with uralane or a similar material for increased corrosion resistance.

Figure 5:
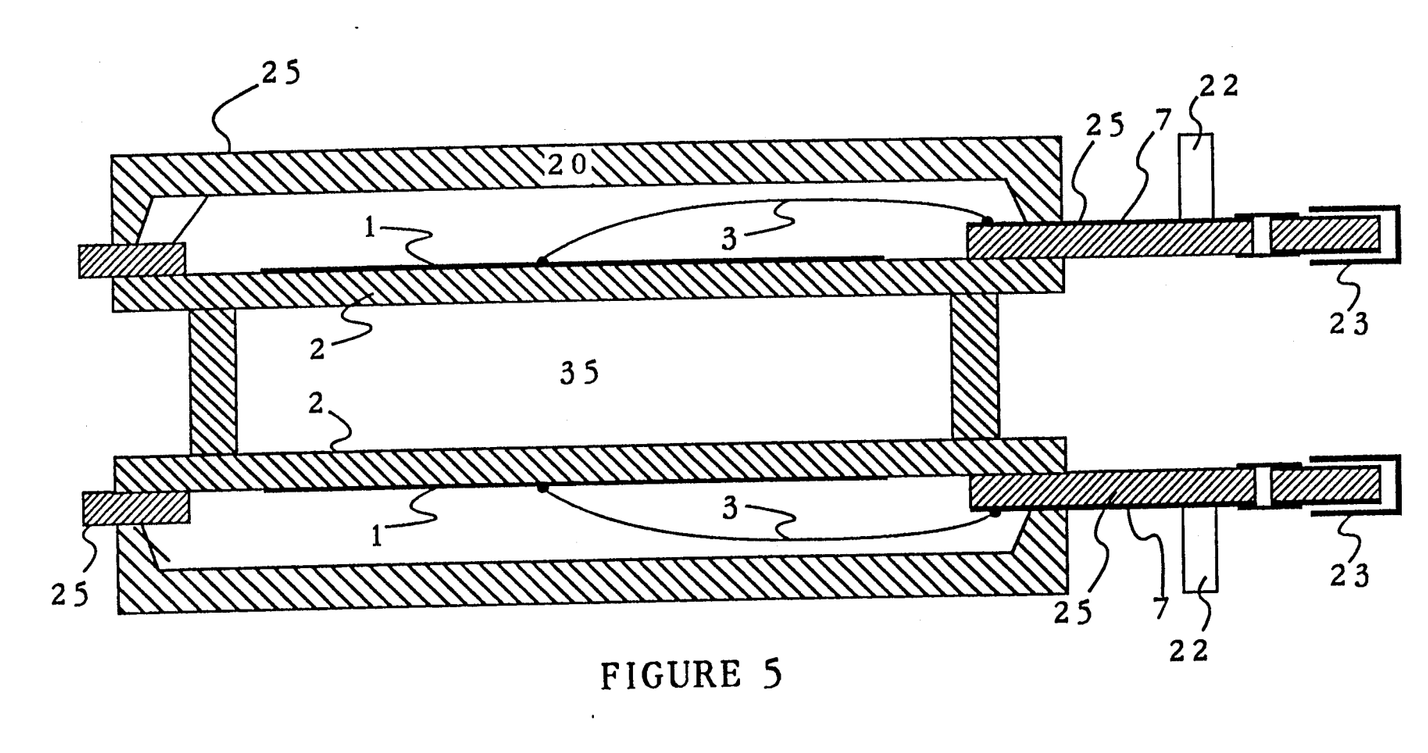
FIG. 5 is a cross sectional view of two packages connected base plate to base plate, and separated by a cooling channel.

FIG. 5 shows a "double waferpak module", wherein two of the modules shown in FIGS. 2A, 3A or 3B are connected base plate to base plate. Like reference numerals in FIGS. 2A and 5 denote similar elements. The two base plates are separated by a channel 35 through which air or some other fluid coolant is circulated. If necessary, the base plates 2 in FIGS. 2A, 2C, 3A, 3B and 5 can be provided with fins to permit more rapid heat dissipation. If the heat to be generated by the wafers or chips supported by the two base plates is sufficient low, channel 35 may be filled with a solid piece of material having good thermal conductivity suitable for use as a heat sink, or the two base plates can simply be bonded together, typically by soldering.

Additional embodiments will become obvious to those skilled in the art in light of the above disclosure. Such additional embodiments are intended to fall within the scope of the present invention.

We therefore claim:

1. A semiconductor package having an interior and an exterior, said package comprising:
   at least one semiconductor integrated circuit structure;

a supporting means attached to said semiconductor integrated circuit structure, said supporting means providing structural rigidity and being formed substantially of a material having a high thermal conductivity;

means for conducting electronic signals from said interior of said package to said exterior of said package, said means for conducting comprising a plurality of insulating pieces and at least one conductive line, said at least one conductive line extending through at least one of said insulating pieces from said interior to said exterior, said insulating pieces being attached to said supporting means and each of said insulating pieces being attached to at least two of the others of said insulating pieces so as to form a closed figure around said semiconductor integrated circuit structure; and a cover, said cover combining with said supporting means and said means for conducting to enclose said integrated circuit structure.

2. A package as in claim 1 wherein said supporting means comprises a base plate and said integrated circuit structure is bonded directly to said base plate.

3. A package as in claim 2 in which said base plate is constructed of material which has a coefficient of thermal expansion not more than $5\times 10^{-6}$ in./in./° C. different from the coefficient of thermal expansion of said semiconductor integrated circuit structure.

4. A package as in claim 2 in which said base plate is situated under and attached to a metal core of a printed circuit board, and in which said coefficient of thermal expansion of said base plate differs by not more than $5\times 10^{-6}$ in./in./° C. from the coefficient of thermal expansion of said metal core.

5. A package as in claim 4 in which said coefficient of thermal expansion of said metal core differs from the coefficient of thermal expansion of said means for conducting by not more than $5\times 10^{-6}$ in./in./° C.

6. A package as in claim 2 wherein:
said at least one integrated circuit structure has formed on it a solderable material; and
said solderable material is bonded directly to said base plate.

7. A package as in claim 6 in which said base plate is constructed of material which has a coefficient of thermal expansion not more than $5\times 10^{-6}$ in./in./° C. different from the coefficient of thermal expansion of said substrate.

8. A package as in claim 1 wherein said integrated circuit structure comprises a semiconductor wafer.

9. A package as in claim 1 wherein said integrated circuit structure comprises at least one integrated circuit chip.

10. A package as in claim 2 in which said base plate forms an electrical ground plane.

11. A package as in claim 2 in which said base plate comprises molybdenum.

12. A package as in claim 11 in which said base plate further comprises surface layers of copper applied to said molybdenum.

13. A package as in claim 11 in which said base plate further comprises surface layers of nickel applied to said molybdenum.

14. A package as in claim 2 in which said base plate is situated under and is attached to a printed circuit board, and said base plate and said printed circuit board form a protective depression in which said integrated circuit structure is located.

15. A package as in claim 2 in which said base plate is shaped to form a protective depression in which said integrated circuit structure is located.

16. A package as in claim 15 in which said base plate forms the metal core of a metal core printed circuit board.

17. A package as in claim 2 in which said base plate forms the metal core of a metal core printed circuit board.

18. A package as in claim 2 in which said base plate is in electrical contact with the metal core of a metal core printed circuit board.

19. A package as in claim 2 in which said base plate is in thermal contact with the metal core of a metal core printed circuit board.

20. A package as in claim 1 wherein said means for conducting comprises:
a first hermetic insulating layer;
a second hermetic insulating layer located above said first hermetic insulating layer;
conductive signal traces extending from one side to the other side of said first and second hermetic insulating layers between said first and second hermetic insulating layers;
said first and second hermetic insulating layers and said conductive signal traces being joined to form a hermetic means for conducting such that said electronic signals can be conducted by said traces through said hermetic means for conducting from said interior of said package to said exterior of said package.

21. A package as in claim 1 in which said insulating piece comprises alumina ($Al_2O_3$).

22. A package as in claim 1 in which said insulating piece comprises BeO.

23. A package as in claim 20 in which said hermetic insulating layers are constructed of glass.

24. A package comprising two packages as in claim 2, a first package and a second package, said base plate of said first package being oriented to face said base plate of said second package, the two base plates being separated by at least one channel through which a coolant may be circulated.

25. A package comprising two packages as in claim 2, a first package and a second package, said base plate of said first package being oriented to face said base plate of said second package, the two base plates being separated by solid material which serves as a heat sink.

26. A package comprising two packages as in claim 2, a first package and a second package, said base plate of said first package being oriented to face said base plate of said second package, the two base plates being adjacent to one another.

27. A package comprising two packages as in claim 2, a first package and a second package, said base plate of said first package being oriented to face said base plate of said second package, the two base plates being bonded together.

28. A semiconductor package having an interior and an exterior, said package comprising:
at least one semiconductor integrated circuit structure;
a base plate attached to said semiconductor integrated circuit structure, said base plate forming a heat spreader and heat sink for said package;
a metal core printed circuit board having an aperture, said metal core of said metal core printed circuit board having an exposed portion around said aperture, said exposed portion being attached to said base plate;

means for conducting electronic signals from said interior of said package to said exterior of said package; and a cover, said cover combining with said base plate and said means for conducting to enclose said integrated circuit structure.

29. A package as in claim 1 wherein said semiconductor integrated circuit package comprises a semiconductor wafer more than inches in diameter.

30. A semiconductor package having an interior and an exterior, said package comprising:
   at least one semiconductor integrated circuit structure;
   a base plate attached to said semiconductor integrated circuit structure, said base plate forming a heat spreader for said package and providing structural rigidity;
   means for conducting electronic signals from said interior of said package to said exterior of said package, said means for conducting being mechanically attached to said base plate, said means for conducting comprising a plurality of ceramic pieces through each of which extends from said interior to said exterior at least one conductive line, said plurality of ceramic pieces being joined to each other to form a sealed means for conducting; and
   a cover attached to said means for conducting, said cover combining with said base plate and said means for conducting to enclose said integrated circuit structure;
   the coefficients of thermal expansion of said integrated circuit structure, said base plate, and said means for conducting being sufficiently well matched to prevent thermally caused mechanical failure of said semiconductor integrated circuit structure for any temperature history expected during operation of said package.

31. A semiconductor package having an interior and an exterior, said package comprising:
   at least one semiconductor integrated circuit structure;
   a base plate attached to said semiconductor integrated circuit structure, said base plate forming a heat spreader for said package and providing structural rigidity, said base plate comprising a metal core of a metal core printed circuit board;
   means for conducting electronic signals from said interior of said package to said exterior of said package, said means for conducting being smaller than sufficient to surround said integrated circuit structure; and
   a cover combining with said base plate and said means for conducting to enclose said integrated circuit structure;
   the coefficients of thermal expansion of said integrated circuit structure, said base plate, said cover, and said means for conducting being sufficiently well matched to prevent thermally caused mechanical failure of said semiconductor integrated circuit structure for any temperature history expected during operation of said package.

32. A package as in claim 1 in which the coefficients of thermal expansion of said integrated circuit structure, said base plate, and said means for conducting are sufficiently well matched to prevent thermally caused mechanical failure of said semiconductor integrated circuit structure for any temperature history expected during operation of said package.

33. A semiconductor package comprising:
   a metal base plate;
   an integrated circuit structure attached to the metal base plate;
   a plurality of insulating pieces attached to the base plate, the insulating pieces being positioned in the form of a closed figure on the base plate so as to surround the integrated circuit structure;
   a cover attached to the insulating pieces;
   the insulating pieces, the cover and the base plate forming an enclosure around the integrated circuit structure; and
   means for conducting electronic signals from outside the enclosure to inside the enclosure, the means for conducting comprising the plurality of insulating pieces and at least one conductive line, the at least one conductive line extending through at least one of the insulating pieces.

34. The semiconductor package of claim 33 wherein the metal base plate, the insulating pieces and cover are made of materials that are impermeable by air and the insulating pieces are hermetically attached to each other and to the cover and base plate so as to form a hermetically-sealed enclosure around the integrated circuit structure.

35. The semiconductor package of claim 33 wherein the base plate comprises the metal core of a metal core printed circuit board, the metal core being exposed in an area of the printed circuit board, the integrated circuit structure and the insulating pieces being attached to the metal core in that area.

36. The semiconductor package of claim 33 comprising a printed circuit board, the printed circuit board having an aperture, the base plate being attached to the printed circuit board around the periphery of the aperture in the printed circuit board, an electrical connection being made between a conductive path in the printed circuit board and the conductive path making electrical contact with the integrated circuit structure.

37. The semiconductor package of claim 33 comprising a metal core printed circuit board, the printed circuit board having an aperture, the metal core of the printed circuit board being exposed in an area along the periphery of the aperture, the base plate being attached to the exposed metal core in that area, an electrical connection being made between a conductive path in the printed circuit board and the conductive path making electrical contact with the integrated circuit structure.

38. The semiconductor package of claim 33 wherein each of the insulating pieces comprises a ceramic material.

39. The semiconductor package of claim 33 wherein the base plate is made at least in part of molybdenum.

40. The semiconductor package of claim 33 wherein the cover is made at least in part of a metal.

41. The semiconductor package of claim 33 wherein a recess is formed in the base plate, and the integrated circuit structure is placed in the recess, thereby improving the capability of the package to transfer heat generated by the integrated circuit structure.

42. The semiconductor package of claim 33 wherein the integrated circuit structure comprises a wafer.

43. A semiconductor package comprising:
   a metal base plate having two surfaces;

an integrated circuit structure attached to a first surface of the metal base plate;

a printed circuit board having two surfaces and having a hole formed in it, the first surface of the base plate being attached to a first surface of the printed circuit board so as to cover the hole;

a cover attached to a second surface of the printed circuit board, the cover covering the hole, whereby the base plate, then printed circuit board, and the cover form an enclosure around the integrated circuit structure; and at least one conductive path extending through the printed circuit board from outside the enclosure and making electrical contact with the integrated circuit structure.

44. The semiconductor package of claim 43 wherein the integrated circuit structure comprises a wafer.

45. A semiconductor package comprising:

a printed circuit board comprising a metal core sandwiched between a plurality of insulating layers, the metal core being exposed in an area of the printed circuit board;

an integrated circuit structure attached to the exposed metal core of the printed circuit board in that area;

a cover attached to the printed circuit board outside the area in which the metal core is exposed, whereby the printed circuit board and the cover form an enclosure around the integrated circuit structure; and at least one conductive path extending through the printed circuit board from outside the enclosure and making contact with the integrated circuit structure.

46. The semiconductor package of claim 45 wherein the integrated circuit structure comprises a wafer.

47. A package as in claim 33 in which said conductive lines are formed in at least part of their length from tape automated bonding (TAB) material.

* * * * *

UNITED STATES PATENT AND TRADEMARK OFFICE
CERTIFICATE OF CORRECTION

PATENT NO.    :   5,223,741
DATED         :   June 29, 1993
INVENTOR(S)   :   Richard L. Bechtel et al.

It is certified that error appears in the above-identified patent and that said Letters Patent is hereby corrected as shown below:

Col. 5, line 55, delete "$5 \times 10^{316}$" and substitute --$5 \times 10^{-6}$--

Signed and Sealed this

Thirtieth Day of August, 1994

Attest:

BRUCE LEHMAN

*Attesting Officer*    *Commissioner of Patents and Trademarks*